United States Patent
Konshak et al.

(10) Patent No.: US 6,471,308 B1
(45) Date of Patent: Oct. 29, 2002

(54) FRAMELESS STACKABLE CABINET SYSTEM FOR RACK MOUNTED ELECTRONIC EQUIPMENT

(75) Inventors: Michael Vaughn Konshak, Louisville; Dale Robert Eichel, Broomfield, both of CO (US)

(73) Assignee: Storage Technology Corporation, Louisville, CO (US)

( * ) Notice: Subject to any disclaimer, the term of this patent is extended or adjusted under 35 U.S.C. 154(b) by 27 days.

(21) Appl. No.: 09/128,045

(22) Filed: Aug. 3, 1998

(51) Int. Cl.[7] .............................................. A47B 87/00
(52) U.S. Cl. ..................... 312/108; 312/111; 312/223.1
(58) Field of Search ........................... 312/265.5, 265.6, 312/265.4, 309, 328, 107, 111, 265.2, 247, 198, 205, 223.6, 216, 108

(56) References Cited

U.S. PATENT DOCUMENTS

| | | | | |
|---|---|---|---|---|
| 3,012,835 A | * | 12/1961 | Anderson | 312/265.5 |
| 4,265,501 A | * | 5/1981 | Halliburton | 312/265.6 |
| 4,418,627 A | * | 12/1983 | Baker | 312/111 |
| 4,681,378 A | * | 7/1987 | Hellman, II | 312/223.6 |
| 5,921,643 A | * | 7/1999 | Louth | 312/223.1 |

FOREIGN PATENT DOCUMENTS

FR          1374952     *  9/1964   ................. 312/263

* cited by examiner

*Primary Examiner*—Peter M. Cuomo
*Assistant Examiner*—Jerry A. Anderson
(74) *Attorney, Agent, or Firm*—Duft, Graziano & Forest; Wayne P. Bailey

(57) ABSTRACT

The frameless, stackable cabinet system for use with rack mounted electronic equipment comprises stackable wall members that mechanically interconnect without the need for tools to assemble the cabinet. A base unit and cover unit provide the interlocking top and bottom members of the cabinet. The stackable wall members come in various heights and can be interlocked together and to both the base unit and cover unit to configure a cabinet of desired height. Each stackable wall member therefore not only provides a mounting site for a rack mounted piece of electronic equipment, but also serves to provide the wiring channels through openings formed in the stackable wall members. The cabinet system can be transported in a disassembled form to reduce shipping costs and can be simply assembled on site via the interlocking interconnection of the stackable wall members. The resultant cabinet can be reconfigured without a significant effort and the certification of the resultant cabinet configuration can be simplified.

14 Claims, 3 Drawing Sheets

FRAMELESS STACKABLE CABINET SYSTEM FOR RACK MOUNTED ELECTRONIC EQUIPMENT

FIELD OF THE INVENTION

This invention relates to rack mounted electronic equipment and more particularly to a frameless cabinet system that is comprised of a plurality of stackable wall members that mechanically interconnect with minimal labor content to assemble the resultant cabinet.

PROBLEM

It is a problem in the field of rack mounted electronic equipment to provide a cabinet system that is adaptable, inexpensive and can be assembled with minimal labor. Typical cabinet systems comprise an integral frame that supports the exterior finish panels of the cabinet housing. The frame provides both the rigidity of the cabinet as well as the rack mounted equipment mounting sites. A difficulty with such a cabinet system is that the cabinet is typically shipped in assembled form due to the integral frame, thereby incurring increased shipping costs. Furthermore, the cabinet is of fixed dimensions and cannot be easily adapted for other equipment configurations or external finish requirements. Finally, it is common for each cabinet-equipment configuration to be individually certified, thereby increasing the cost and time required for development and production of equipment.

SOLUTION

The above-described problems are solved and a technical advance achieved by the present frameless, stackable cabinet system for use with rack mounted electronic equipment. This cabinet system comprises stackable wall members that mechanically interconnect without the need for tools to assemble the cabinet. A base unit and cover unit provide the interlocking top and bottom members of the cabinet. The stackable wall members come in various heights and can be interlocked together and to both the base unit and cover unit to configure a cabinet of desired height. Each stackable wall member therefore not only provides a mounting site for a rack mounted piece of electronic equipment, but also serves to provide the wiring channels through openings formed in the stackable wall members. The cabinet system can be transported in a disassembled form to reduce shipping costs and can be simply assembled on site via the interlocking interconnection of the stackable wall members. The resultant cabinet can be reconfigured without a significant effort and the certification of the resultant cabinet configuration can be simplified.

DETAILED DESCRIPTION

The present frameless, stackable cabinet system comprises stackable wall members that mechanically interconnect with minimal labor to assemble the cabinet. A base unit and cover unit provide the interlocking top and bottom members of the cabinet. The stackable wall members come in various heights and can be interlocked together and to both the base unit and cover unit to configure a cabinet of desired height. Each stackable wall member therefore not only provides a mounting site for a rack mounted piece of electronic equipment, but also serves to provide the wiring channels through openings formed in the stackable wall members. The cabinet system can be transported in a disassembled form to reduce shipping costs and can be simply assembled on site via the interlocking interconnection of the stackable wall members. The resultant cabinet can be reconfigured without a significant effort and the certification of the resultant cabinet configuration can be simplified.

Figure 1:
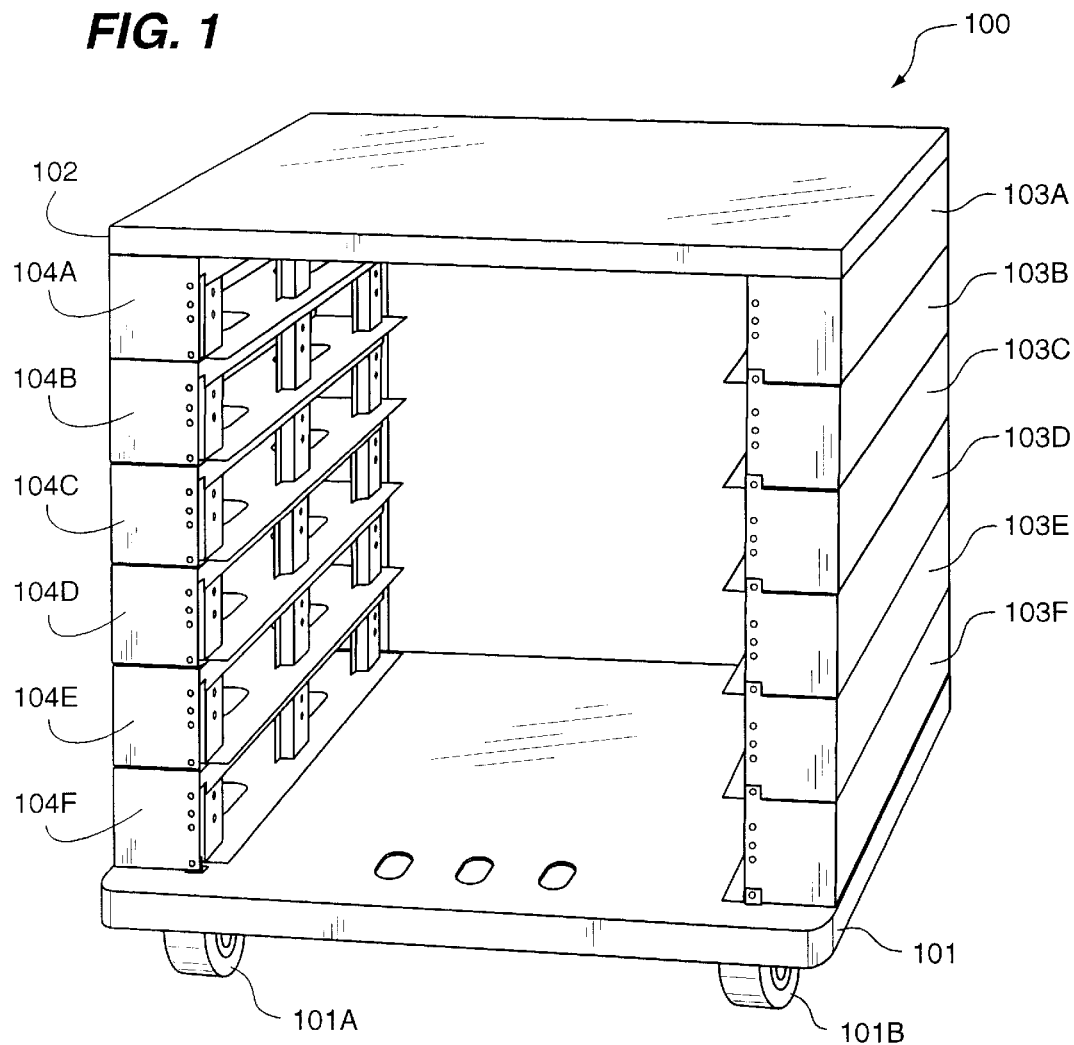
FIG. 1 illustrates a perspective view of the present frameless, stackable cabinet system for use with rack mounted electronic equipment.
Figure 2:
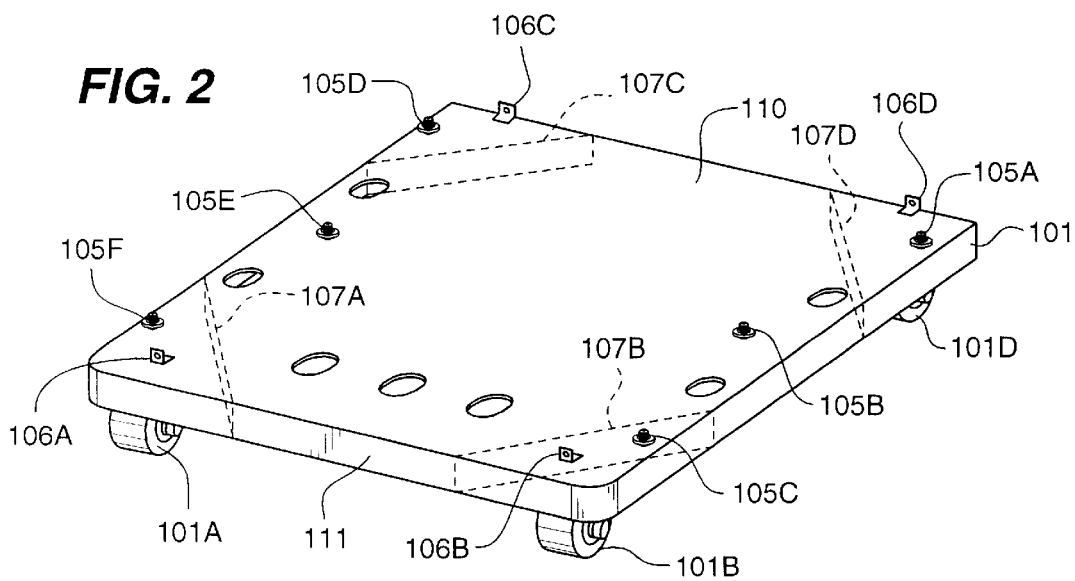
FIG. 2 illustrates a perspective view of the base unit of the present frameless, stackable cabinet system for use with rack mounted electronic equipment.

FIG. 1 illustrates a perspective view of the present frameless, stackable cabinet system for use with rack mounted electronic equipment 100 and FIG. 2 illustrates a perspective view of the base unit 101. As shown in FIG. 1, a base unit 101 and a cover unit 102 provide the top and bottom members of the frameless, stackable cabinet system 100. A plurality of stackable wall members 103A–103F and 104A–104F comprise the right side and left side walls respectively, of the frameless, stackable cabinet system 100. The height of the stackable wall members 103A–103F and 104A–104F can be uniform or can vary to accommodate different height racks of electronic equipment. Thus, the overall height of the frameless, stackable cabinet system 100 can be customized to match a particular mix of racks of electronic equipment and the particular placement of the racks of electronic equipment within the cabinet can be selected without being limited by the stackable wall members 103A–103F and 104A–104F of the frameless, stackable cabinet system 100, since the stackable wall members 103A–103F and 104A–104F can be intermixed at will. The bottommost ones of the stackable wall members 104F, 103F are mounted on the base unit 101 via fasteners as described below, and the topmost ones of the stackable wall members 104A, 103A are mounted to the cover unit 102 via the same fasteners.

The base unit 101 as shown in additional detail in FIG. 2 comprises a flat plate 110, that can optionally include side members 111, on which is mounted a plurality of fasteners 105A–105F that are used to interconnect stackable wall members 104F, 103F as described in additional detail below. The plurality of fasteners 105A–105F are configured in two sets of fasteners, each of which comprises a plurality of fasteners oriented in a predetermined pattern to match the corresponding fastener apertures of the stackabble wall members. The base unit 101 can optionally include a plurality of support members 107A–107D that serve to provide additional rigidity to the base unit 101. A plurality of wall elements 101A–101D are also optionally provided, attached to the bottom of flat plate 110 to enable the resultant frameless, stackable cabinet system 100 to be transported by rolling across the floor. Finally, a plurality of mounting brackets 106A–106D can optionally be provided to enable the mounting of cabinet trim members to the frameless, stackable cabinet system 100 and to secure the bottommost stackable wall members 104F, 103F to the base unit 101 as described below.

Figure 3:
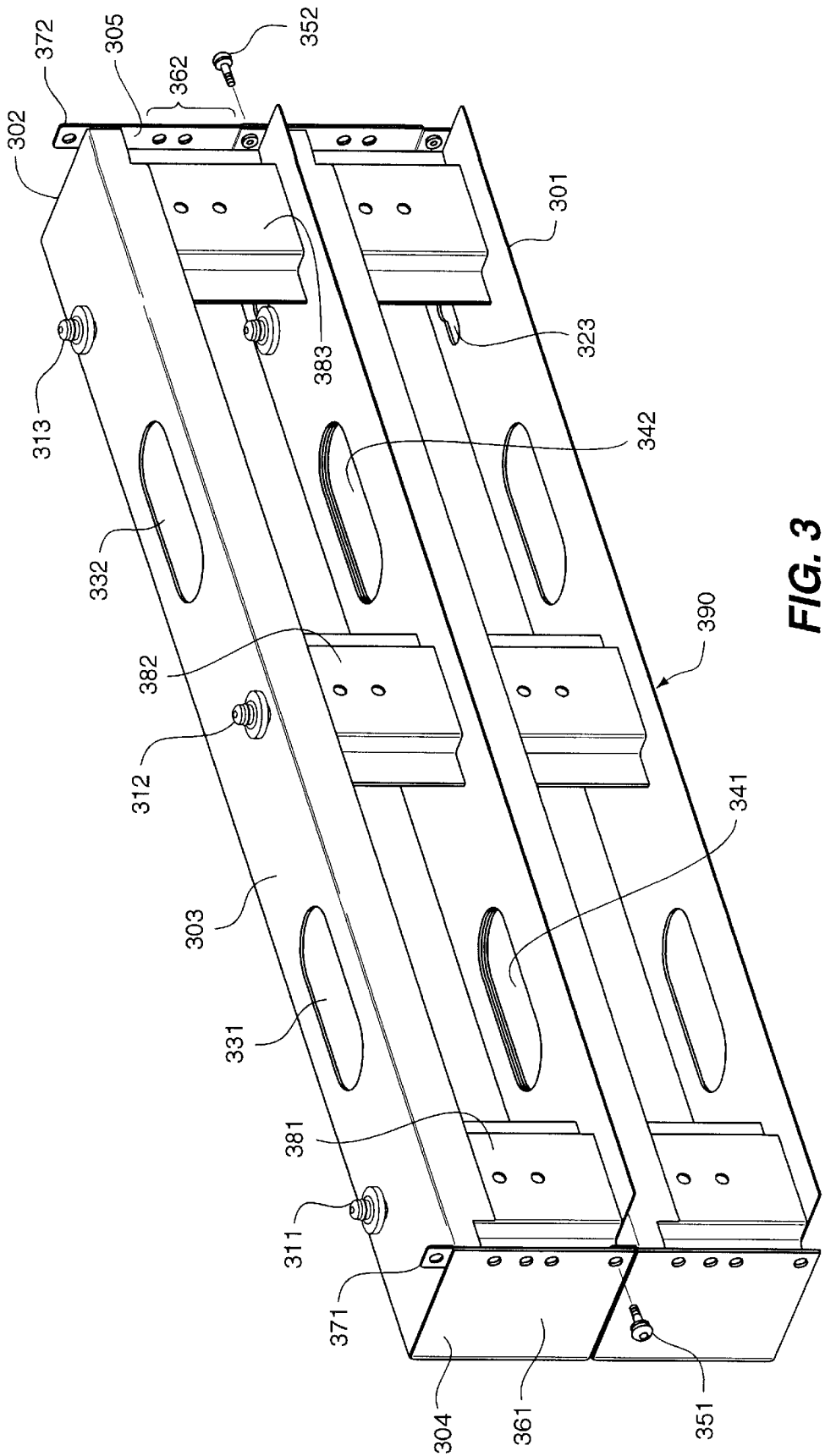
FIG. 3 illustrates a perspective view of the interconnection of a pair of the stackable wall members of the present frameless, stackable cabinet system for use with rack mounted electronic equipment.
Figure 4:
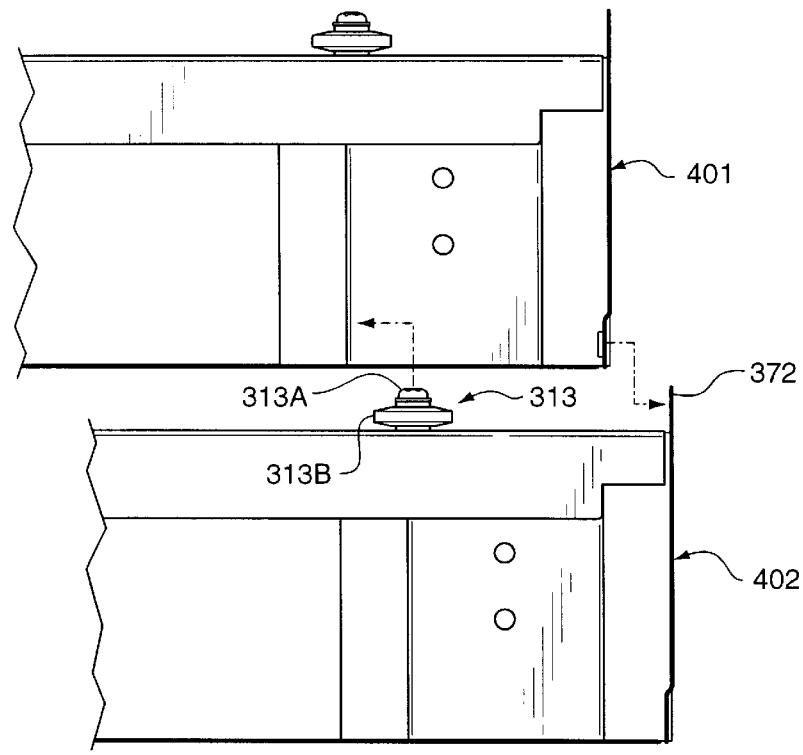
FIGS. 4 and 5 illustrate side and top plan views respectively, of the interconnection of a pair of the stackable wall members of the present frameless, stackable cabinet system for use with rack mounted electronic equipment.
Figure 5:
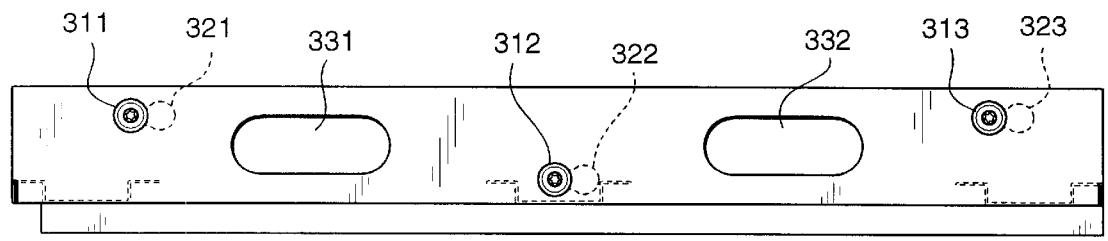

FIG. 3 illustrates a perspective view and FIGS. 4 and 5 illustrate side and top plan views respectively, of the interconnection of a pair of the stackable wall members of the present frameless, stackable cabinet system for use with rack mounted electronic equipment. The basic stackable wall member 302, as shown in FIG. 3, is applicable for use in either wall of the frameless, stackable cabinet system 100 due to its symmetric design. Therefore, stackable wall members are economical to manufacture since they represent the single element needed to implement both cabinet walls. The stackable wall member 302 comprises a C-shaped body 303 that is open to the inside of the cabinet and that includes a plurality of internal support members 381–383 that interconnect the top and bottom sides of the body 303 to provide rigidity and support in the vertical direction. The body 303 includes cable routing apertures 331, 332 formed in the top side and cable routing apertures 341, 342 formed in the bottom side to thereby form a conduit to enable the routing of cabling in the vertical direction through the side walls of the frameless, stackable cabinet system 100. The body 303 also includes a front face plate 304 and rear face plate 305 to provide a surface to which the rack mounted electronic equipment is affixed. The front face plate 304 and rear face plate 305 include a plurality of holes 361, 362 designed for this purpose. The front face plate 304 and rear face plate 305 also include a pair of holes 371, 372 respectively, that extend above the body 302 to enable the use of a fastener 351, 352 to secure body 302 to the adjacent stackable wall member in a secure manner. Each stackable wall member 302 also includes a plurality of fasteners 311–313 and a like plurality of fastener apertures 321–323. As shown in FIGS. 4 and 5, the fastener 313 fits through the fastener aperture 323 to interlock the two stackable wall members 401, 402 together. The fastener apertures 321–323 are keyhole shaped to prevent the removal of the corresponding fastener 311–313 once inserted therein and translated in a horizontal direction from the large diameter opening in the fastener aperture 321–323 to the small diameter opening in the fastener aperture 321–323. The fastener 313 itself comprises a bolt or screw 313A that is threaded through a saucer shaped element 313B into the body of the stackable wall member 402. The shape of the saucer shaped element 313B is selected to guide the fastener aperture to seat between the saucer-shaped element 313B and the body of the stackable wall member 402.

Thus, the stackable wall members 103 and 104 can be used to implement a frameless cabinet with little assembly labor required, since the stackable wall members 103 and 104 interlock on to the base unit 101 and each other to create a cabinet of the desired height. The additional fasteners 351, 352 are used to prevent movement between adjacent stackable wall members. The cover unit 102 is formed to be also interlock to the topmost stackable wall members and is equipped with the fastener apertures, to interconnect with the fasteners of the topmost ones of the stackable wall members 104A, 103A. The base unit 101 and cover unit 102, when interconnected with the stackable wall members 103 and 104 form a cabinet of significant rigidity and strength. The installation of the rack mounted electronic equipment further enhances the stability of the cabinet. The holes formed on the front face plate 304 of the body 302 of the stackable wall member can be used to fasten a cover plate or trim on to the front of the cabinet. Thus, the cabinet can be provided with custom trim without requiring a redesign of the cabinet and the height of the cabinet can be selected to correspond to the number and size of the racks of electronic equipment mounted therein. The expansion and contraction of the cabinet can be easily accommodate by the addition or removal of stackable wall members.

What is claimed is:

1. A frameless, stackable cabinet system for housing a plurality of rack mounted apparatus, comprising:

a base unit, having two sets of fastener elements mounted on a top side thereof, each of said sets comprising a predetermined number of fastener elements in a predetermined pattern;

a plurality of wall members, each of which have said predetermined number of said fastener elements mounted on a top side thereof in said predetermined pattern and said predetermined number of fastener apertures formed in a bottom side thereof in said predetermined pattern to receive said predetermined number of said fastener elements mounted on a top side of a one of: an adjacent wall member and said base unit; and wherein said plurality of wall members are stacked one on top of the other in two equal height stacks and mounted on said base unit, with said fastener apertures formed in a bottom side of a bottommost wall member of each stack receiving said predetermined number of said fastener elements of a corresponding one of said sets of fastener elements mounted on said top side of said base unit, and wherein said fastener elements are insertable through the corresponding fastener apertures in a first direction and translatable in another direction to interlock adjacents ones of said plurality of wall members.

2. The frameless, stackable cabinet system of claim 1 wherein said two sets of fastener elements are positioned along two opposing edges of said base unit so that said two stacks of wall members when mounted on said base unit form opposing walls of a cabinet, located a predetermined distance apart.

3. The frameless, stackable cabinet system of claim 2 further comprising:

a cover unit, having two sets of said fastener apertures mounted on a bottom side thereof, each of said sets comprising a predetermined number of fastener apertures in a predetermined pattern to receive corresponding ones of said predetermined number of said fastener elements mounted on a top side of topmost ones of said two stacks of wall members.

4. The frameless, stackable cabinet system of claim 3 wherein each of said plurality of wall members comprises:

a body having said top side and said bottom side;

a front face plate mounted on a front side of said body and having at least one aperture formed therein for accepting at least one fastener for mounting a rack mounted apparatus thereto.

5. The frameless, stackable cabinet system of claim 4 wherein each of said plurality of wall members further comprises:

a plurality of apertures formed in said top side and said bottom side of said body for enabling the routing of electrical wiring there through.

6. The frameless, stackable cabinet system of claim 4 wherein each of said plurality of wall members further comprises:

means for interconnecting said front face plate of a first of said plurality of wall members with an adjacent one of said wall members when said first and said adjacent wall members are mounted in a one of said two stacks.

7. The frameless, stackable cabinet system of claim 1, wherein said fastener apertures are keyhole shaped.

8. A frameless, stackable cabinet system for housing a plurality of rack mounted apparatus, comprising:
- a plurality of wall members, comprising:
  - a body having a top side and a bottom side,
  - a predetermined number of fastener elements mounted on said top side of said body in a predetermined pattern,
  - said predetermined number of fastener apertures formed in said bottom side of said body in said predetermined pattern to receive said predetermined number of said fastener elements mounted on a top side of an adjacent wall member; and
- wherein said plurality of wall members are stacked one on top of the other in two equal height stacks, with said fastener apertures formed in a bottom side of a wall member of each stack receiving said predetermined number of said fastener elements of a corresponding one of said sets of fastener elements mounted on said top side of an adjacent one of said wall members, and wherein said fastener elements are insertable through the corresponding fastener aperatures in a first direction and translatable in another direction to interlock adjacents ones of said plurality of wall members.

9. The frameless, stackable cabinet system of claim 8, wherein said fastener apertures are keyhole shaped.

10. The frameless, stackable cabinet system of claim 8 wherein each of said plurality of wall members further comprises:
- a front face plate mounted on a front side of said body and having at least one aperture formed therein for accepting at least one fastener for mounting a rack mounted apparatus thereto.

11. The frameless, stackable cabinet system of claim 10 wherein each of said plurality of wall members further comprises:
- means for interconnecting said front face plate of a first of said plurality of wall members with an adjacent one of said wall members when said first and said adjacent wall members are mounted in a one of said two stacks.

12. The frameless, stackable cabinet system of claim 8 wherein each of said plurality of wall members further comprises:
- a plurality of apertures formed in said top side and said bottom side of said body for enabling the routing of electrical wiring there through.

13. The frameless, stackable cabinet system of claim 8 further comprising:
- a base unit, having two sets of fastener elements mounted on a top side thereof, each of said sets comprising said predetermined number of fastener elements in said predetermined pattern, wherein said two sets of fastener elements are positioned along two opposing edges of said base unit so that said two stacks of wall members when mounted on said base unit form opposing walls of a cabinet, located a predetermined distance apart.

14. The frameless, stackable cabinet system of claim 13 further comprising:
- a cover unit, having two sets of said fastener apertures mounted on a bottom side thereof, each of said sets comprising a predetermined number of fastener apertures in a predetermined pattern to receive corresponding ones of said predetermined number of said fastener elements mounted on a top side of topmost ones of said two stacks of wall members.

\* \* \* \* \*